United States Patent
Hirano et al.

(10) Patent No.: US 7,002,230 B2
(45) Date of Patent: Feb. 21, 2006

(54) CDTE-BASE COMPOUND SEMICONDUCTOR SINGLE CRYSTAL FOR ELECTRO-OPTIC ELEMENT

(75) Inventors: Ryuichi Hirano, Kitaibaraki (JP); Hideyuki Taniguchi, Kitaibaraki (JP)

(73) Assignee: Nikko Materials Co., Ltd., Tokyo (JP)

( * ) Notice: Subject to any disclaimer, the term of this patent is extended or adjusted under 35 U.S.C. 154(b) by 16 days.

(21) Appl. No.: 10/771,359

(22) Filed: Feb. 5, 2004

(65) Prior Publication Data

US 2004/0155310 A1   Aug. 12, 2004

(30) Foreign Application Priority Data

Feb. 7, 2003   (JP)   ............... 2003-030639

(51) Int. Cl.
   *H01L 31/00*   (2006.01)

(52) U.S. Cl. ............... 257/442; 257/442; 257/444

(58) Field of Classification Search .......... 257/442, 257/11, 444, 607, 609
   See application file for complete search history.

(56) References Cited

U.S. PATENT DOCUMENTS 5,535,699 A * 7/1996 Kawazu et al. ............... 117/1

FOREIGN PATENT DOCUMENTS

| JP | 05-155699 | * | 6/1993 |
| JP | 5-267408 A | | 10/1993 |
| JP | 6-95108 B2 | | 11/1994 |
| JP | 7-96478 B2 | | 10/1995 |
| JP | 2947288 B2 | | 7/1999 |

* cited by examiner

*Primary Examiner*—David Nelms
*Assistant Examiner*—Thinh T Nguyen
(74) *Attorney, Agent, or Firm*—Birch, Stewart, Kolasch & Birch, LLP

(57) ABSTRACT

In case of chlorine doping, a CdTe-base compound semiconductor single crystal used for an electro-optic element has a crystal which is set to chlorine concentration ranging from 0.1 ppmwt to 5.0 ppmwt and has no precipitation having diameter of 2 $\mu$m or above. In case of chlorine doping, an indium doping, a CdTe-base compound semiconductor single crystal used for an electro-optic element has a crystal which is obtained from a CdTe material melt, to which indium is doped at concentration ranging from 0.01 ppmwt to 1.0 ppmwt, according to a liquid phase epitaxial growth method and has a solidification ratio of 0.9 or below.

4 Claims, 6 Drawing Sheets

CDTE-BASE COMPOUND SEMICONDUCTOR SINGLE CRYSTAL FOR ELECTRO-OPTIC ELEMENT

BACKGROUND OF THE INVENTION

This Nonprovisional application claims priority under 35 U.S.C. § 119(a) on Patent Application No(s). 2003-030639 filed in JAPAN on Feb. 7, 2003, the entire contents of which are hereby incorporated by reference.

1. Field of the Invention

The present invention relates to a II–VI compound semiconductor single crystal, and particularly to a CdTe-base compound semiconductor single crystal useful as a material of an electro-optic element used for a voltage detector or the like.

2. Description of Related Art

In an earlier development, it is known that a CdTe-base compound semiconductor single crystal belonging to II–VI compound semiconductor is useful for a radiation detector (for example, refer to Japanese Patent Application Publication (Examined) No. Tokukouhei H07-96478). When the CdTe-base compound semiconductor single crystal is used as a base material of the radiation detector, the crystal used for the detector is desired to have high resistivity (for example, $1.0 \times 10^9$ Ω·cm or above) for the purpose of achieving high resolution for high energy while reducing noises.

Generally, to heighten resistivity of the CdTe-base compound semiconductor single crystal, a method of doping halogen such as chlorine or the like into the crystal is used. The inventors of this specification propose CdTe single crystal which is obtained by doping a predetermined amount of chlorine into the CdTe single crystal to heighten resistivity of the CdTe single crystal to $1.0 \times 10^9$ Ω·cm or above (refer to Japanese Patent Application No. Tokugan 2002-076313).

Further, it is known that the CdTe-base compound semiconductor single crystal is an electro-optic material having a property of changing refractive index in proportional to a voltage applied to the single crystal (for example, refer to Journal of Nonlinear Optical Physics and Materials Vol. 5, No. 2 (1996) pp. 247–268). The electro-optic material having the property is, for example, used as an electro-optic element such as a voltage (or electric field) detector or the like (for example, refer to Japanese Patent Application Publication (Examined) No. Tokukouhei H06-95108, Japanese Patent Application Publication No. Tokkaihei H05-267408, Japanese Patent No. 2947288 and Japanese Patent Application Publication (Examined) No. Tokukouhei H07-96478).

Hereinafter, an example of the voltage detector will be described with reference to FIG. 5. FIG. 5 is a view schematically showing the configuration of a general voltage detector.

A voltage detector 100 shown in FIG. 5 has an optical probe (electro-optic element) 10 closely placed in adjacent to or making in contact with a measured subject, an optical section 30 for guiding a light beam outgoing from a light source 31 to the optical probe 10, and a comparison and detection section 20 for comparing a reference beam output from the light source 31 and an outgoing beam transmitted through and returned from the optical probe 10.

The optical probe 10 has an electro-optic material 11 made of a compound semiconductor single crystal, a connection unit 12 for guiding the beam transmitted from the optical section 30 into the electro-optic material 11, a metal thin film 13 attached to the top of the electro-optic material 11, and a conductive electrode 14 arranged on the outer circumference of the electro-optic material 11. The comparison and detection section 20 has an analyzer 21, photoelectric conversion elements 22 and 23, a comparison circuit 24 and an output terminal 25. The optical section 30 has the light source 31, a polarizer 32, beam splitters 33 and 34, a collimator 35 and an optical fiber 36.

When the optical probe 10 is closely placed in adjacent to or makes in contact with the measured subject, an electric field is induced between the conductive electrode 14 set to an appropriate electric potential (for example, ground potential) and the metal thin film 11, and a refractive index of the electro-optic material 11 is changed by the electric field. Thereafter, the polarization state of the beam transmitted through the electro-optic material 11 is changed in dependent on the change of the refractive index of the electro-optic material 11.

In the voltage detector 100 described above, when a light beam is output from the light source 31 such as a laser diode or the like driven by direct current, only a light beam L having a predetermined polarization component is extracted from the output light beam by the polarizer 32, and the light beam L is divided into a reference beam L1 and an incident beam L2 by the beam splitter 33.

The incident beam L2 is guided to the optical probe 10 through the beam splitter 34, the collimator 35 and the optical fiber 36 and is incident on the electro-optic material 11 through the connecter unit 12. Thereafter, the incident beam L2 is transmitted through the electro-optic material 11 and is reflected on the metal thin film 13. Thereafter, the reflected beam is transmitted backward through the electro-optic material 11, the connecter unit 12, the optical fiber 36 and the collimator 35 and is incident on the beam splitter 34 as an outgoing beam L3. Thereafter, the outgoing beam L3 is reflected on the beam splitter 34 and is incident on the analyzer 21. Thereafter, the outgoing beam L3 is converted into an electric signal in the photoelectric converter element 22. The reference beam L2 obtained in the beam splitter 33 is incident on the photoelectric converter element 23 and is converted into an electric signal.

Thereafter, the electric signals output from the photoelectric converter elements 22 and 23 are compared with each other in the comparison circuit 24, and a intensity ratio signal indicating a ratio of the level of the electric signal of the photoelectric converter element 22 and the level of the electric signal of the photoelectric converter element 23 is output from the output terminal 25 and is obtained. That is, the polarization state of the beam transmitted through the electro-optic material 11 is changed in dependent on the change of the refractive index of the electro-optic material 11, and the intensity of the outgoing beam L3 is changed with the polarization state of the beam. Therefore, a voltage of a predetermined portion of the measured subject can be detected by comparing the intensity of the outgoing beam L3 and the intensity of the reference beam L1.

In the Applications No. H6-95108, No. H7-96478 and No. H5-267408 and the Patent No. 2947288, the compound semiconductor single crystals such as lithium tantalate ($LiTaO_3$), lithium niobate ($LiNbO_3$), KTP ($KTiOPO_4$), arsenic gallium (GaAs) and the like are used.

However, though CdTe-base compound semiconductor used as the electro-optic material is known, CdTe-base compound semiconductor is not generally used as a material of the electro-optic element such as a voltage detector. That is, to use CdTe-base compound semiconductor for the electro-optic element, though CdTe-base compound semiconductor having a property of high resistivity and high transmittance (low absorption coefficient) is needed, CdTe-base compound semiconductor having the property is not known.

SUMMARY OF THE INVENTION

In order to solve the above problem, an object of the present invention is to provide a CdTe-base compound semiconductor single crystal, which is useful as an electro-optic element such as a voltage detector or the like.

In order to accomplish the above-mentioned object, in accordance with an aspect of the present invention, a CdTe-base compound semiconductor single crystal useful as an electro-optic element such as a voltage detector or the like comprises a crystal which is set to chlorine concentration ranging from 0.1 ppmwt to 5.0 ppmwt and has no precipitation having a diameter of 2 μm or above.

The CdTe-base compound semiconductor single crystal above-described has the absorption coefficient of 4 cm$^{-1}$ or below. Therefore, the lowering of the intensity of the beam transmitted through the single crystal can be suppressed. Further, the electrical resistivity of the single crystal at the room temperature is $1.0 \times 10^8$ Ω·cm or above. Therefore, the occurrence of noise can be effectively suppressed. Accordingly, the CdTe-base compound semiconductor single crystal is useful as the electro-optic element such as the voltage detector or the like, and the voltage detector capable to detect the voltage at high sensitivity and low noise can be obtained.

Further, an indium-doped CdTe-base compound semiconductor single crystal has low absorption coefficient and high resistivity. Therefore, the indium-doped CdTe-base compound semiconductor single crystal is useful as a material of an electro-optic element. Particularly, indium is doped into a CdTe material melt at concentration ranging from 0.01 ppmwt to 1.0 ppmwt, and a CdTe-base compound semiconductor single crystal is obtained from the indium-doped CdTe material melt according to a liquid phase epitaxial growth method. A portion of the CdTe-base compound semiconductor single crystal having a solidification ratio of 0.9 or below has precipitations having size of 2 μm or below and is appropriate to the material of the electro-optic element.

The portion having the solidification ratio of 0.9 or below denotes a portion of the obtained CdTe-base compound semiconductor single crystal ranging from a growth start position to a growth position at which the solidification ratio reaches 0.9.

Next, how the present invention is completed will be described hereinafter.

The inventors made a plurality of chlorine-doped CdTe single crystals according to the liquid phase epitaxial growth method by using a plurality of CdTe polycrystals made while changing an amount of doped chlorine as crystal materials. Thereafter, the inventors measured transmittance of each obtained chlorine-doped CdTe single crystal set as a sample and examined the relation between the chlorine concentration and the transmittance in the crystal. Thickness of the CdTe single crystals used for the measurement of the transmittance were set to almost 1 mm.

Measurement results are shown in FIG. 1. As shown in FIG. 1, the higher the chlorine concentration in the CdTe single crystal is, the lower the transmittance is.

Further, because both the thickness of the CdTe single crystals set as the samples and the reflection of beams on incident faces and outgoing faces of the samples influence the measurement results of FIG. 1, absorption coefficients A of the CdTe single crystals were calculated to remove the influence and were compared with one another. The absorption coefficients A were calculated according to a following formula.

$$T=(1-R)^2 exp(-A \times d)$$

Where T denotes transmittance (%), R denotes reflectance (12%: value in literature), and d denotes thickness (mm) of sample.

The relation between the chlorine concentration and the absorption coefficient is shown in FIG. 2. As shown in FIG. 2, the relation between the chlorine concentration and the absorption coefficient is indicated more considerably than the relation shown in FIG. 1. Therefore, when the chlorine concentration in the CdTe single crystal is, for example, 5 ppmwt or below, the absorption coefficient is 4 or below, and the CdTe single crystal is appropriate to a material of the electro-optic element.

Further, even though the chlorine concentration in the CdTe single crystal is 5 ppmwt or below, the absorption coefficient was sometimes considerably heightened. Therefore, the inside of each crystal was observed by an infrared microscope, and precipitations having diameter of 2 μm or above were found out in the crystal. That is, the absorption coefficient and precipitations in the crystal are closely related to each other, and the inventors obtained knowledge that it was important to suppress the occurrence of precipitations to lower the absorption coefficient of the CdTe single crystal.

As a result of the experiment described above, it was apparent that a CdTe single crystal having the chlorine concentration of 5 ppmwt or below and having no precipitation of 2 μm or above had a low absorption coefficient and was appropriate to a material of the electro-optic element. Further, a CdTe single crystal having high resistivity of $1.0 \times 10^8$ Ω·cm or above can be obtained by setting the chlorine concentration in the crystal to 0.1 ppmwt or above.

Next, the inventors examined an indium-doped CdTe single crystal of which resistivity could be heightened by doping a very small amount of indium into the crystal. In Published Japanese Patent Application (Tokkaisyou) S63-185898, indium is doped in a crystal at concentration of 1 ppmwt or below when the crystal is grown, and the indium-doped CdTe single crystal having high resistivity of $1.0 \times 10^8$ Ω·cm or above is obtained. In this indium-doped CdTe single crystal, because an amount of doped indium is very small, the inventors think that transmittance of the crystal is high.

Therefore, the inventors used an indium-doped CdTe single crystal having indium concentration of 0.05 ppmwt (lowest measurable value of analysis apparatus) or below as a sample, transmittance values of the indium-doped CdTe single crystal were measured in the same manner as in the chlorine-doped CdTe single crystals described above, and absorption coefficients of portions of the indium-doped CdTe single crystal were calculated. The indium-doped CdTe single crystal was made according to the liquid phase epitaxial growth method while doping indium into the crystals at concentration of 0.03 ppmwt.

In the indium-doped CdTe single crystal described above, it is difficult to accurately measure indium concentration in the crystal. Therefore, the relation between the solidification ratio in crystal growth and the calculated absorption coefficient was examined (refer to FIG. 3). By referring to FIG. 3, the lower the solidification ratio is, the smaller the absorption coefficient is.

Therefore, it can be supposed that the indium concentration in the crystal is changed with the solidification ratio of the crystal. Further, because the indium concentration is heightened when the solidification ratio is heightened, it can be supposed that the absorption coefficient is heightened when the solidification ratio is heightened. In the indium-doped CdTe single crystal, portions of the grown crystal having the solidification ratio of 0.9 or below especially have low absorption coefficients and are appropriate to a material of the electro-optic element.

Further, the resistivity of the indium-doped CdTe single crystal is in the order of $1.0 \times 10^9$ Ω·cm regardless of the solidification ratio of the crystal in crystal growth, and the inventors ascertained that the resistivity of the indium-doped CdTe single crystal was considerably high (refer to FIG. 4).

As described above, in case of the chlorine doping, the inventors had knowledge that the CdTe-base compound semiconductor single crystal appropriate to the electro-optic element could be obtained by prescribing the crystal according to the chlorine concentration in the crystal and precipitations in the crystal. In case of indium doping, the inventors had knowledge that the CdTe-base compound semiconductor single crystal appropriate to the electro-optic element could be obtained by prescribing the crystal according to the solidification ratio in crystal growth. And then, the present invention was completed.

BRIEF DESCRIPTION OF THE DRAWINGS

The present invention will become more fully understood from the detailed description given hereinbelow and the accompanying drawing which are given by way of illustration only, and thus are not intended as a definition of the limits of the present invention, and wherein.

PREFERRED EMBODIMENTS OF THE INVENTION

Hereinafter, preferred embodiment according to the present invention will be explained with reference to the drawings.

Figure 1:
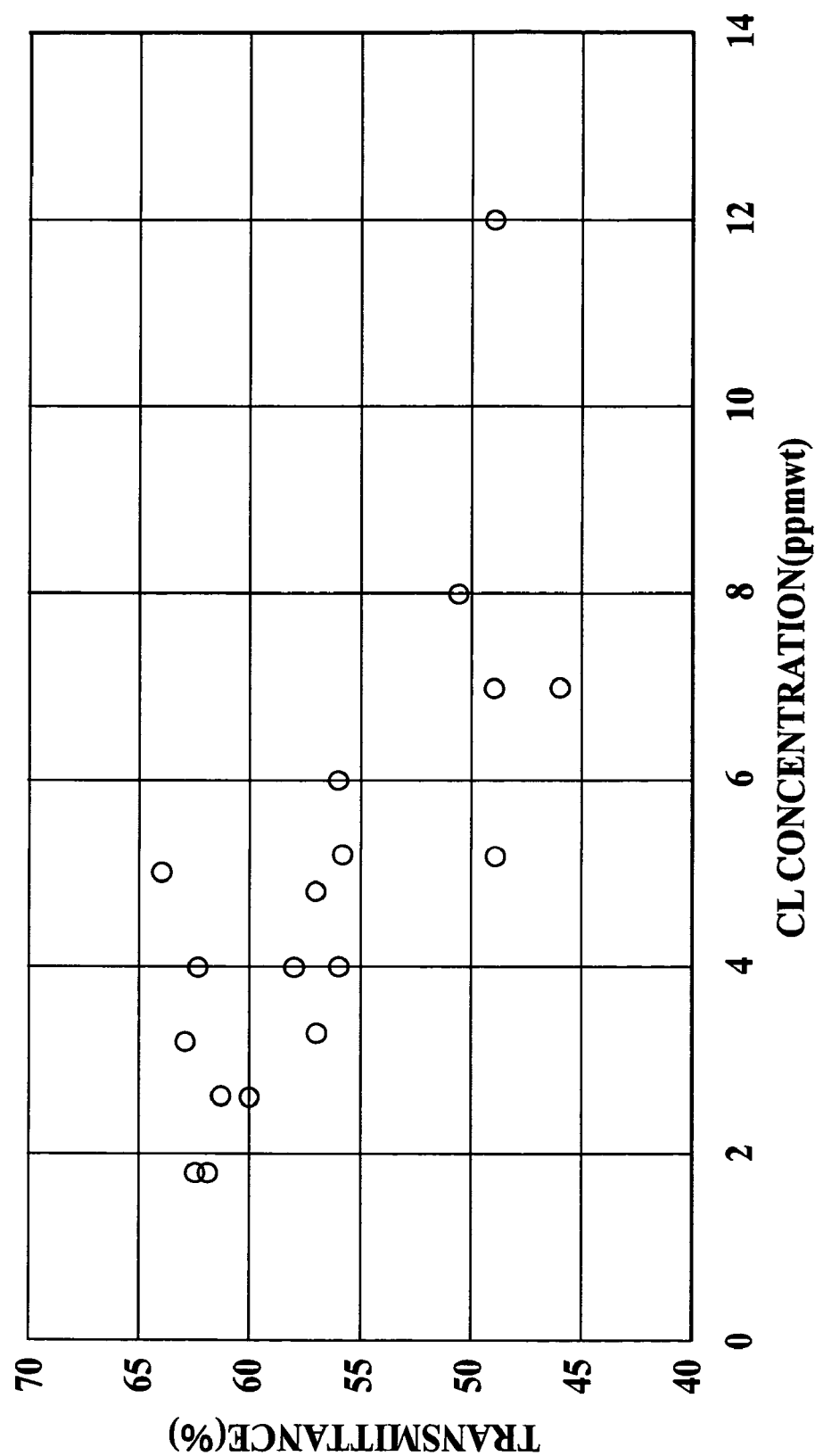
FIG. 1 is an explanatory view showing the relation between chlorine concentration and transmittance in a chlorine-doped CdTe single crystal.
Figure 2:
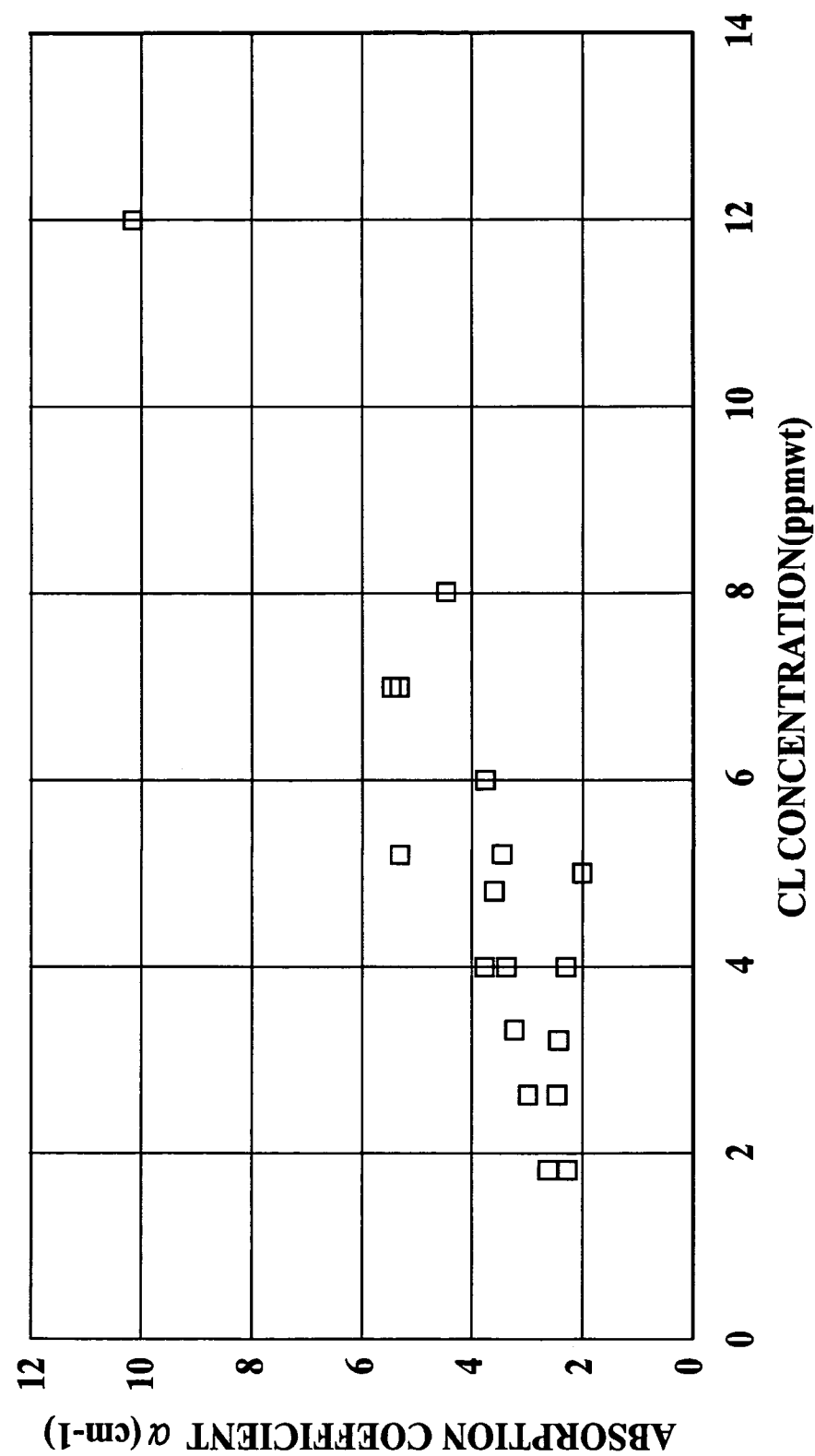
FIG. 2 is an explanatory view showing the relation between chlorine concentration and absorption coefficient in the chlorine-doped CdTe single crystal.
Figure 3:
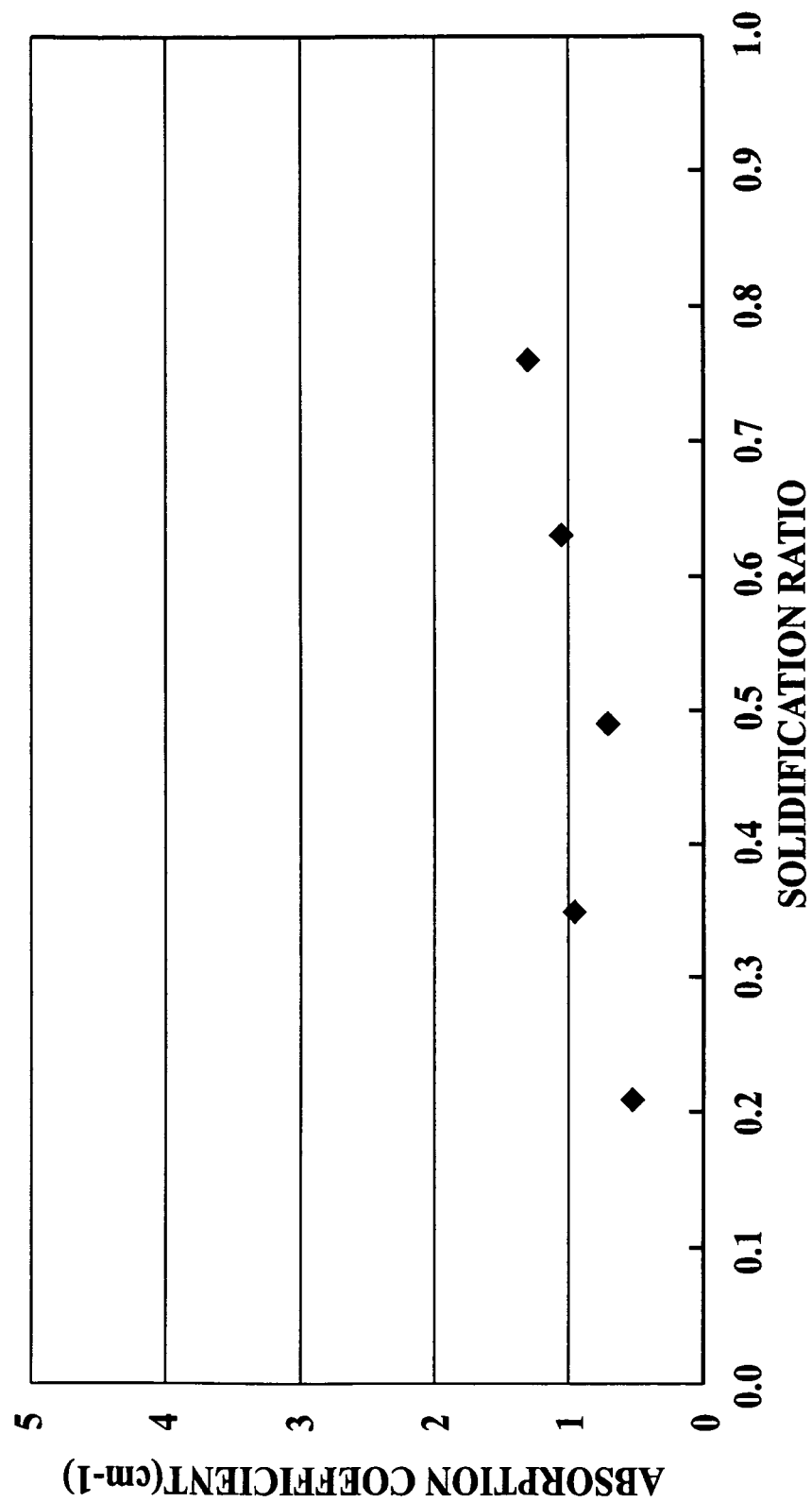
FIG. 3 is an explanatory view showing the relation between solidification ratio and absorption coefficient in an indium-doped CdTe single crystal in crystal growth.
Figure 4:
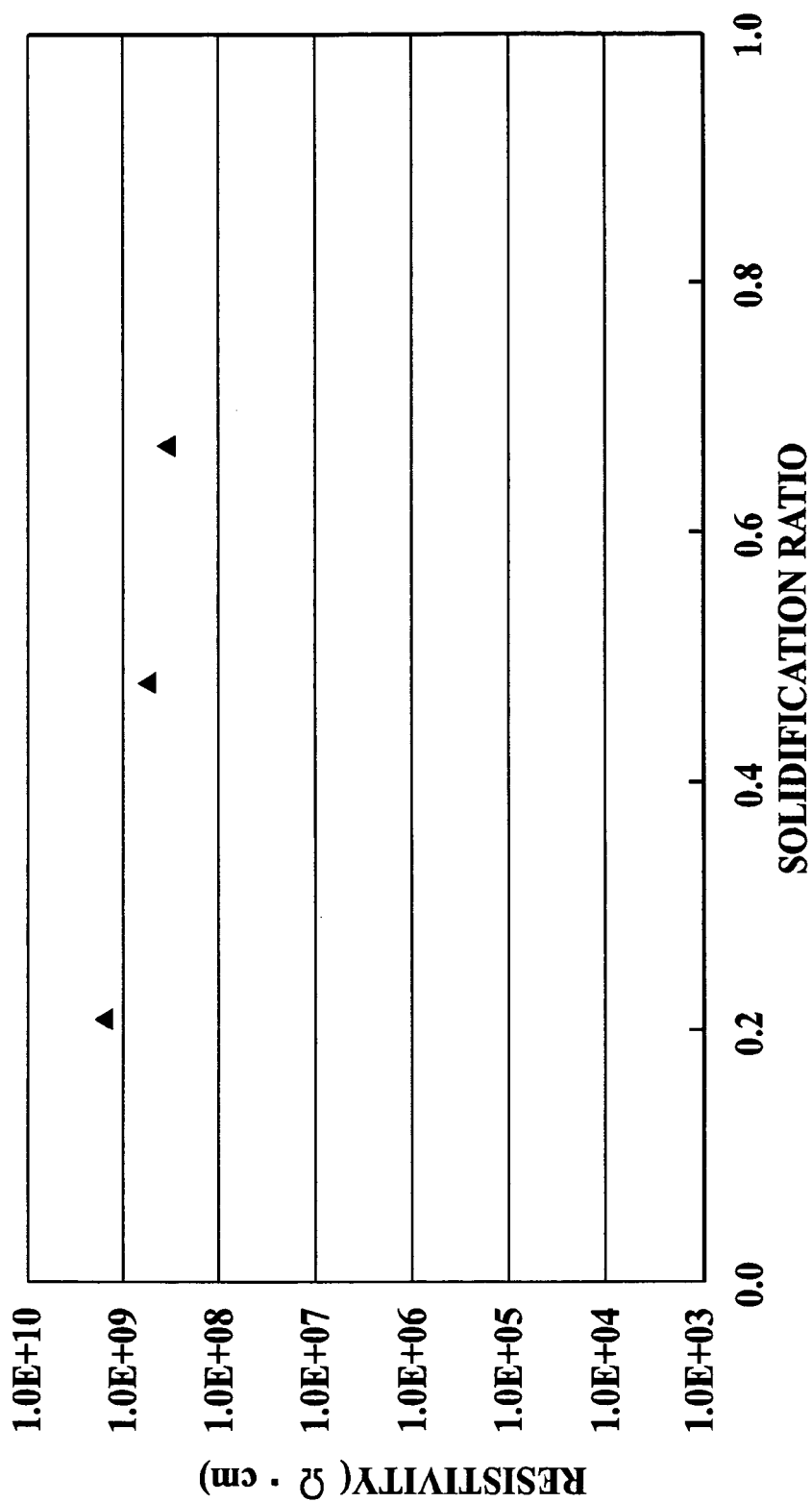
FIG. 4 is an explanatory view showing the relation between solidification ratio and transmittance in the indium-doped CdTe single crystal in crystal growth.
Figure 5:
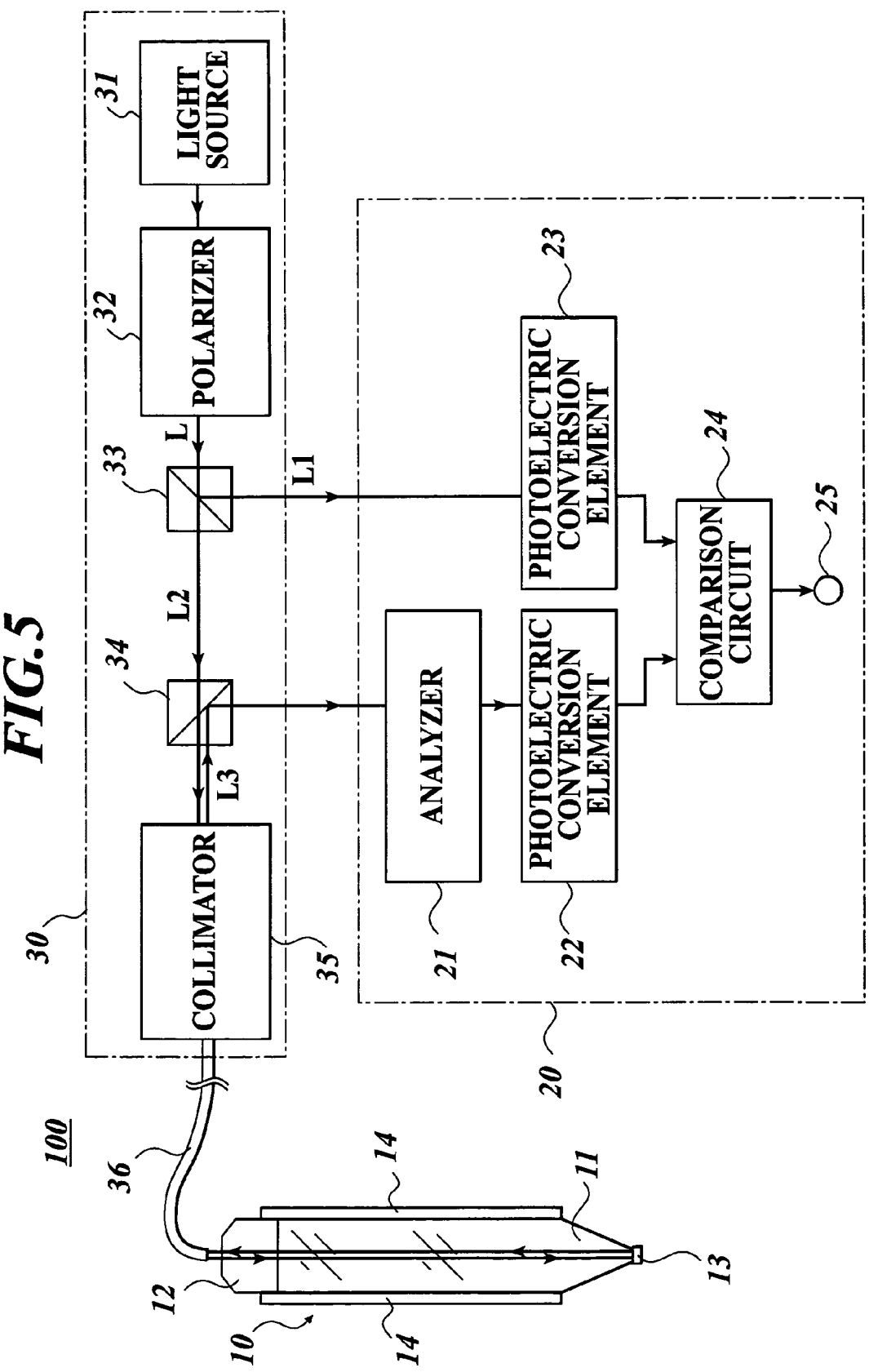
FIG. 5 is a view schematically showing the configuration of a general voltage detector.
Figure 6:
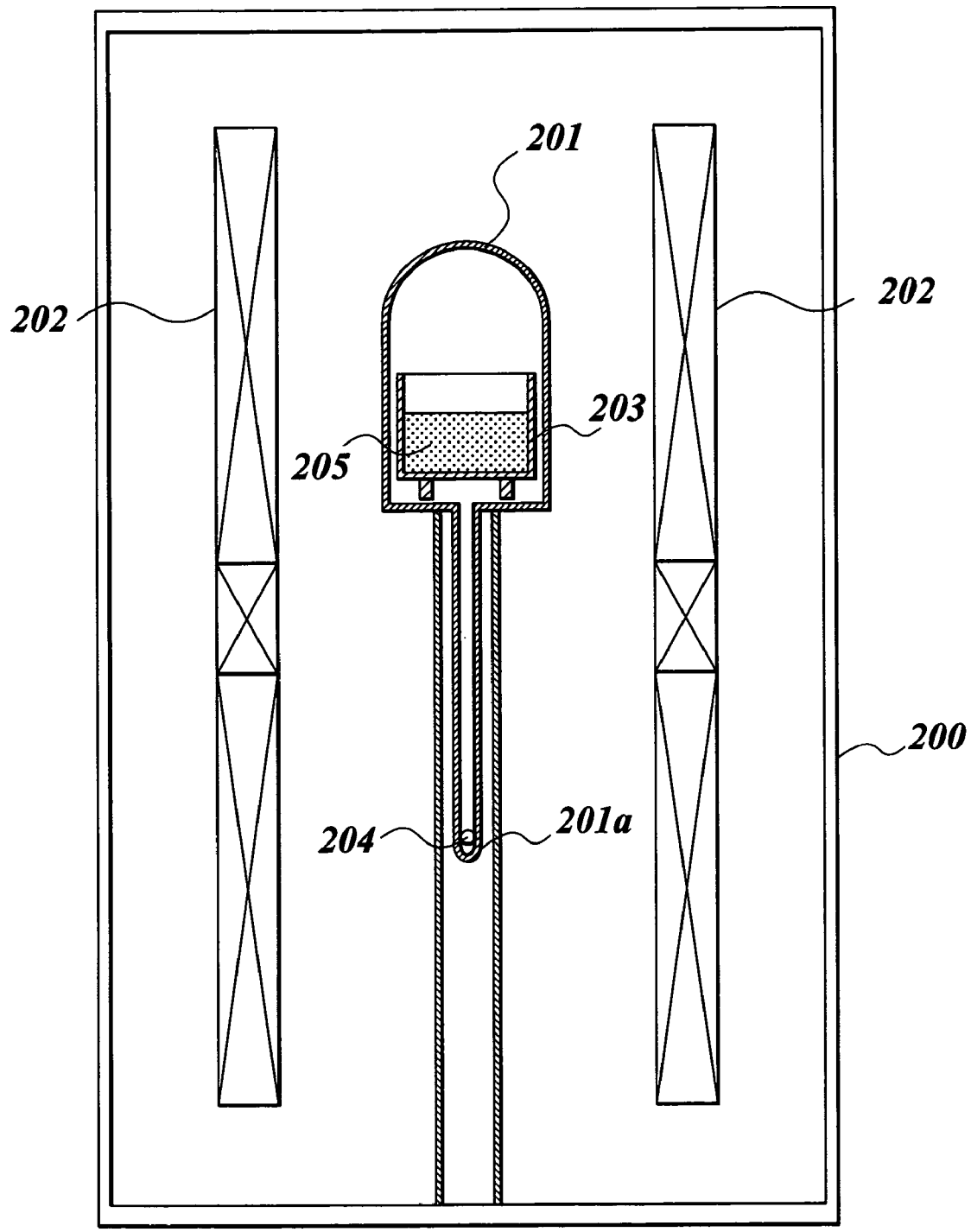
FIG. 6 is a constitutional view schematically showing a crystal growth apparatus used for crystal growth according to an embodiment.

FIG. 6 is a constitutional view schematically showing a crystal growth apparatus in which a CdTe single crystal according to the present invention is grown according to a vertical gradient freezing (VGF) method.

In FIG. 6, a reference numeral 200 denotes a high pressure container, and a quartz ampoule 201 having a reservoir 201a is arranged in the center of the high pressure container 200. A made-of-pBN crucible 203 is arranged in the quartz ampoule 201, and heaters 202 are arranged so as to surround the quartz ampoule 201. Though the configuration of each heater 202 is not limited, the heaters 202 is preferably made, for example, in a multistage structure of three stages. As shown in FIG. 6, in this structure, the heater 202 corresponding to the crucible 203 and the heater 202 corresponding to the reservoir 201a can be heated at temperatures different from each other respectively, and the temperature distribution of the high pressure container 200 can be minutely controlled.

Hereinafter, the crystal growth of a chlorine-doped CdTe single crystal performed by using the crystal growth apparatus described above will be explained.

Cadmium (Cd) 204 denoting an easily volatile element was put in the reservoir 201a of the quartz ampoule 201 by approximately 10 g in weight. A CdTe material 205 was put in the made-of-pBN crucible 203 by approximately 15 g in weight, and the crucible 203 was arranged in the quartz ampoule 201. Thereafter, the quartz ampoule 201 was sealed in vacuum. In this case, a CdTe polycrystal was made by doping chlorine at concentration of 100 ppmwt, and the CdTe material 205 was obtained by dividing the CdTe polycrystal into many blocks.

Thereafter, the CdTe material 205 in the crucible 203 was molten by heating up the crucible 203 by the corresponding heater 202. The reservoir 201a was then heated up to a predetermined temperature, for example, 780° C. by the other heater 202 to control the vapor pressure of cadmium, and the crucible 203 was heated up by the heater 202.

Then, the temperature in the high pressure container 200 was gradually lowered at a temperature lowering rate of 0.1° C./hr while controlling amounts of electric power supplied to the heaters 202 by a control apparatus (not shown) so as to produce a desired temperature distribution in the high pressure container 200, and a CdTe single crystal grown from the surface of the CdTe material melt downward for approximately two hundreds hours.

Thereafter, the CdTe single crystal set to 950° C. and the reservoir 201a set to 700° C. were maintained for approximately twenty hours, and an ingot of the chlorine-doped CdTe single crystal having diameter of 78 mm and length of 60 mm was obtained.

The obtained CdTe single crystal was observed by an infrared microscope. No precipitation having diameter of 2 μm or above was observed in the CdTe single crystal, and resistivity of the CdTe single crystal was $1.0 \times 10^8$ Ω·cm or above. As a result of the measurement of transmittance of the CdTe single crystal, transmittance of the CdTe single crystal was approximately 55% or above, and absorption coefficient of the CdTe single crystal calculated from the transmittance was approximately 4 $cm^{-1}$ or below.

Next, the crystal growth of an indium-doped CdTe single crystal performed by using the crystal growth apparatus described above will be explained.

Cadmium (Cd) 204 denoting an easily volatile element was put in the reservoir 201a of the quartz ampoule 201 by approximately 10 g in weight. A CdTe material 205 was put in the made-of-pBN crucible 203 by approximately 15 g in weight, and the crucible 203 was arranged in the quartz ampoule 201. Thereafter, the quartz ampoule 201 was sealed in vacuum. In this case, the CdTe material 205 was doped by indium at concentration of 0.03 ppmwt by putting the indium with the CdTe material 205 in the crucible 203.

Thereafter, the CdTe material 205 in the crucible 203 was molten by heating up the crucible 203 by the corresponding heater 202. The reservoir 201a was then heated up to a predetermined temperature, for example, 780° C. by the other heater 202 to control the vapor pressure of cadmium, and the crucible 203 was heated up by the heater 202.

Thereafter, the temperature in the high pressure container 200 was gradually lowered at a temperature lowering rate of 0.1° C./hr while controlling amounts of electric power supplied to the heaters 202 by a control apparatus (not shown) so as to produce a desired temperature distribution in the high pressure container 200, and a CdTe single crystal grown from the surface of the CdTe material melt downward for approximately two hundreds hours.

Thereafter, the CdTe single crystal set to 950° C. and the reservoir 201*a* set to 700° C. were maintained for approximately twenty hours, and an ingot of the chlorine-doped CdTe single crystal having diameter of 78 mm and length of 60 mm was obtained.

A portion of the obtained indium-doped CdTe single crystal having solidification ratio of 0.9 or below was observed by an infrared microscope. No precipitation having diameter of 2 $\mu$m or above was observed in the portion of the obtained indium-doped CdTe single crystal, and resistivity of the portion of the indium-doped CdTe single crystal was approximately $1.0 \times 10^9$ $\Omega$·cm. As a result of the measurement of transmittance of the portion, transmittance of the portion of the indium-doped CdTe single crystal was approximately 70% or above, and absorption coefficient of the portion of the indium-doped CdTe single crystal calculated from the transmittance was approximately 2 $cm^{-1}$ or below.

The chlorine-doped CdTe single crystal and the indium-doped CdTe single crystal obtained according to this embodiment have resistivity of $1.0 \times 10^8$ $\Omega$·cm or above and very low absorption coefficient of 4 $cm^{-1}$ or below. Therefore, the chlorine-doped CdTe single crystal and the indium-doped CdTe single crystal are useful for a material of the electro-optic element (for example, an optical probe such as a voltage detector or the like).

The invention performed by the inventors is concretely explained according to the embodiment. However, the present invention is not limited to this embodiment, and modifications may be made to the embodiment without departing from the scope of the invention.

For example, in this embodiment, the method for making the CdTe single crystal be grown according to the VGF method is explained. However, a CdTe single crystal having high resistivity and low absorption coefficient can be manufactured at high productivity according to any of a horizontal gradient freezing method, a vertical Bridgman method, a horizontal Bridgman method and a liquid encapsulation Czochralski method, in the same manner as the VGF method.

The entire disclosure of Japanese Patent Application No. Tokugan 2003-030639 filed on Feb. 7, 2003 including specification, claims, drawings and summary are incorporated herein by reference in its entirety.

What is claimed is:

1. A CdTe-base compound semiconductor single crystal for an electro-optic element, comprising a crystal which is set to chlorine concentration ranging from 0.1 ppmwt to 5.0 ppmwt and has no precipitation having a diameter of 2 $\mu$m or above.

2. A CdTe-base compound semiconductor single crystal for an electro-optic element, comprising a crystal which is obtained from a CdTe material melt, into which indium is doped at concentration ranging from 0.01 ppmwt to 1.0 ppmwt, according to a liquid phase epitaxial growth method, the crystal having a solidification ratio of 0.9 or below.

3. The CdTe-base compound semiconductor single crystal as claimed in claim 1, wherein said crystal has:
    an absorption coefficient of 4 $cm^{-1}$ or below; and
    an electrical resistivity of $1.0 \times 10^8$·$\Omega$ or above.

4. The CdTe-base compound semiconductor single crystal as claimed in claim 2, wherein said crystal has:
    an absorption coefficient of 2 $cm^{-1}$ or below; and
    an electrical resistivity of $1.0 \times 10^9$·$\Omega$ or above.

* * * * *